(12) United States Patent
Yen et al.

(10) Patent No.: US 8,039,910 B2
(45) Date of Patent: Oct. 18, 2011

(54) ELECTRO-ACOUSTIC SENSING DEVICE

(75) Inventors: Kai-Hsiang Yen, Taipei (TW); Jen-Yi Chen, Hsinchu County (TW); Po-Hsun Sung, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 799 days.

(21) Appl. No.: 11/964,995

(22) Filed: Dec. 27, 2007

(65) Prior Publication Data
US 2009/0101998 A1    Apr. 23, 2009

(30) Foreign Application Priority Data

Oct. 17, 2007 (TW) .............................. 96138854 A (51) Int. Cl.
*H01L 29/84* (2006.01)

(52) U.S. Cl. ........ 257/416; 257/419; 257/432; 257/433; 257/254; 257/414; 257/415; 257/E29.324

(58) Field of Classification Search .................. 257/416, 257/432, 433, 419, 254, 414, 415, E29.324
See application file for complete search history.

(56) References Cited

U.S. PATENT DOCUMENTS

| | | | |
|---|---|---|---|
| 6,178,249 B1 * | 1/2001 | Hietanen et al. | 381/174 |
| 6,522,762 B1 | 2/2003 | Mullenborn et al. | |
| 6,732,588 B1 * | 5/2004 | Mullenborn et al. | 73/715 |
| 6,781,231 B2 | 8/2004 | Minervini | |
| 2003/0167850 A1 | 9/2003 | Ishiguro et al. | |
| 2005/0189635 A1 * | 9/2005 | Humpston et al. | 257/678 |

OTHER PUBLICATIONS

Taiwanese language office action dated Feb. 24, 2011.

* cited by examiner

*Primary Examiner* — Junghwa M Im
(74) *Attorney, Agent, or Firm* — Thomas|Kayden (57) ABSTRACT

An electro-acoustic sensing device including a sensing chip, a carrier chip and a sealing element is provided. The sensing chip is for electro-acoustic transuding and thereby outputting an electrical signal. The carrier chip disposed below the sensing chip has at least one second connecting point, at least one electrical channel and at least one channel connecting point. The second connecting point is electrically contacted with the first connecting point. The second connecting point and the channel connecting point are located at different surfaces of the carrier chip. The electrical channel passes through the carrier chip and electrically connects the second connecting point and the channel connecting point. The electrical signal is transmitted to the channel connecting point via the first and the second connecting points and the electrical channel. The sealing element is disposed between the sensing chip and the carrier chip for air-tight coupling the two chips.

17 Claims, 5 Drawing Sheets

ELECTRO-ACOUSTIC SENSING DEVICE

This application claims the benefit of Taiwan application Ser. No. 96138854, filed Oct. 17, 2007, the subject matter of which is incorporated herein by reference.

BACKGROUND OF THE INVENTION

1. Field of the Invention

The invention relates in general to an electro-acoustic sensing device, and more particularly to a capacitive electro-acoustic sensing device.

2. Description of the Related Art

In recent years, consumer electronic products have won great popularity on the market, and various electronic products are widely used in modern people's everyday life. As electronic products are directed towards multi-function and small size, manufacturers are engaged in providing products with better integration and lower costs. Many consumer electronic products, such as mobile phones, personal digital assistants (PDAs), digital voice recorders and portable digital music players, adopt micro-electro-mechanical system (MEMS) microphone and speaker for providing better quality of reception and amplification.

Figure 1:
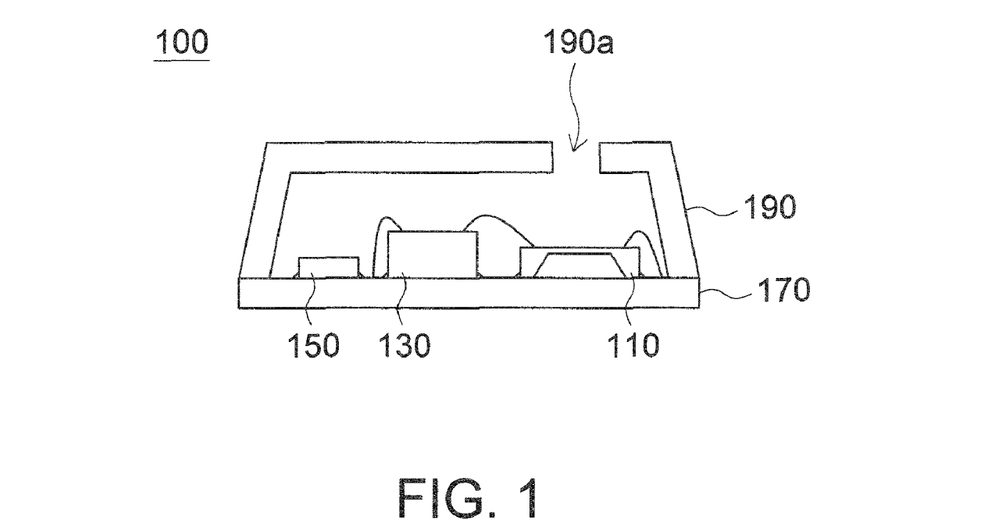
FIG. 1 is a cross-sectional view of a conventional micro-electro-mechanical system microphone.

One of the commonly used structures of micro-electro-mechanical system microphone is a system in package (SIP) structure, in which multiple chips are installed. Please refer to FIG. 1, a cross-sectional view of a conventional micro-electro-mechanical system microphone is shown. In a micro-electro-mechanical system microphone 100, independent elements such as the acoustic wave sensing chip 110, the circuit chip 130 and the surface mount component 150 are respectively disposed on the substrate 170. The protection cover 190 is disposed on the substrate 170 and covers the elements such as acoustic wave sensing chip 110, the circuit chip 130 and the surface mount element 150. The protection cover 190 has a sound entering hole 190a via which the sound signal enters the protection cover 190 and contacts the acoustic wave sensing chip 110. In the micro-electro-mechanical system microphone 100, the acoustic wave sensing chip 110, the circuit chip 130 and the surface mount component 150 are installed on the substrate 170 by way of wire-bonding. The structure and manufacturing process of the micro-electro-mechanical system microphone 100 are complicated, so the manufacturing cost is hard to bring down.

SUMMARY OF THE INVENTION

The invention is directed to an electro-acoustic sensing device formed by stacking and bonding dual chips. Further, by integrating the integrated circuit into one of the chips, fewer elements are needed for manufacturing the electro-acoustic sensing device, thereby reducing the volume of the electro-acoustic sensing device.

According to a first aspect of the present invention, an electro-acoustic sensing device including a sensing chip, a carrier chip and a sealing element is provided. The sensing chip is for electro-acoustic transducing and outputting an electrical signal. The sensing chip has at least one first connecting point. The carrier chip disposed below the sensing chip has at least one second connecting point, at least one electrical channel and at least one channel connecting point. The second connecting point is electrically contacted with the first connecting point. The second connecting point and the channel connecting point are located at different surfaces of the carrier chip. The electrical channel passes through the carrier chip and electrically connects the second connecting point and the channel connecting point. The electrical signal is transmitted to the channel connecting point via the first connecting point, the second connecting point and the electrical channel. The sealing element is disposed between the sensing chip and the carrier chip for air-tight coupling the sensing chip and the carrier chip.

According to a second aspect of the present invention, an electro-acoustic sensing device including two juxtaposed sensing chips, two juxtaposed carrier chips and two sealing elements is provided. The two sensing chips are for electro-acoustic transducing and outputting an electrical signal. Each sensing chip has at least one first connecting point. The two carrier chips respectively disposed below the two sensing chips. Each carrier chip has at least one second connecting point, at least one electrical channel and at least one channel connecting point. The second connecting point is electrically contacted with the first connecting point. The second connecting point and the channel connecting point are located at different surfaces of the carrier chip. The electrical channel passes through each carrier chip and electrically connects the second connecting point and the channel connecting point. The two sealing elements are disposed between two sensing chips and two corresponding carrier chips for air-tight coupling one sensing chip and one carrier chip respectively. The electrical signal is transmitted to the channel connecting point via the first connecting point, the second connecting point and the electrical channel.

The invention will become apparent from the following detailed description of the preferred but non-limiting embodiments. The following description is made with reference to the accompanying drawings.

DETAILED DESCRIPTION OF THE INVENTION

The electro-acoustic sensing device, according to the preferred embodiments of the invention, air-tight couples a sensing chip and a carrier chip by a sealing element. The sensing chip has at least one first connecting point. The carrier chip has at least one second connecting point, at least one electrical channel and at least one channel connecting point. The electrical signal outputted from the sensing chip is transmitted to the substrate via the first connecting point, the second connecting point, the electrical channel and the channel connecting point. Moreover, by integrating an integrated circuit into the sensing chip or the carrier chip, the structure of the electro-acoustic sensing device is simplified, the volume is reduced, the manufacturing process is simplified and the manufacturing cost is decreased. Several embodiments are disclosed below for elaborating the invention but not for limiting the scope of protection of the invention. Moreover, unnecessary elements are omitted in the figures of the embodiments to highlight the characteristics of the invention.

First Embodiment

Figure 2:
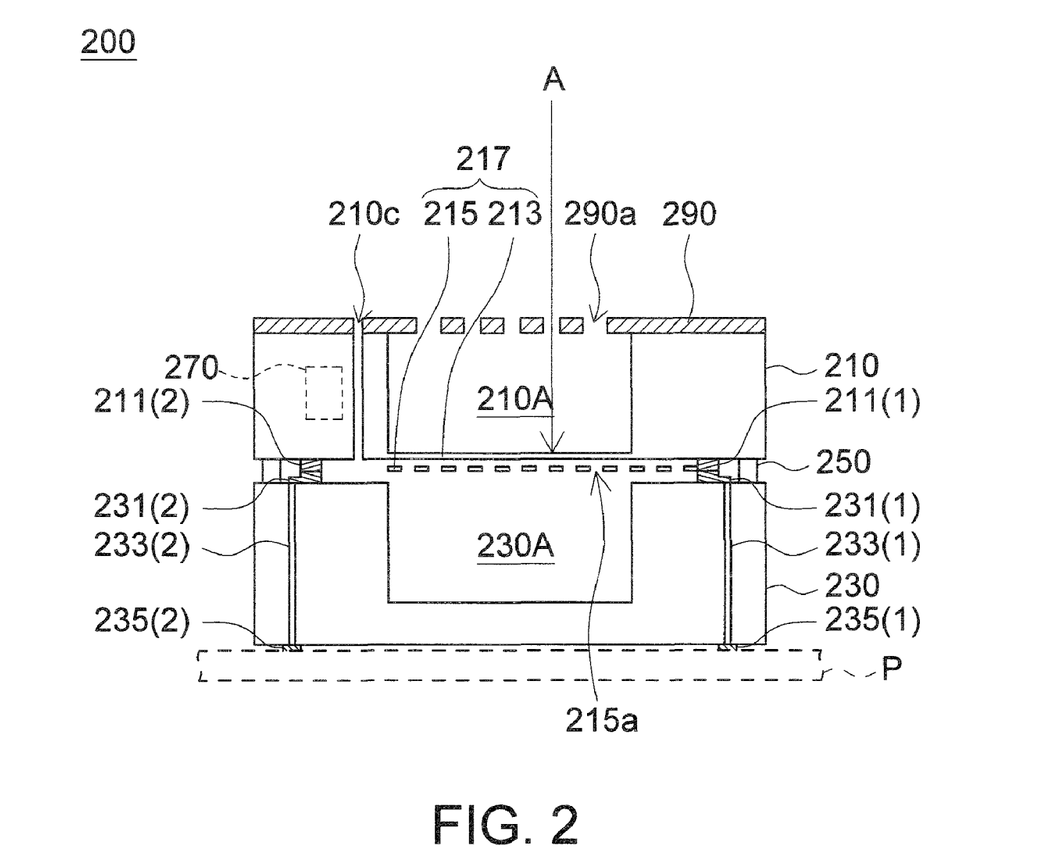
FIG. 2 is a perspective view of an electro-acoustic sensing device according to a first embodiment of the invention.

Please refer to FIG. 2, a perspective view of an electro-acoustic sensing device according to a first embodiment of the invention is shown, The electro-acoustic sensing device 200 includes a sensing chip 210, a carrier chip 230 and a sealing element 250. The sensing chip 210 is for electro-acoustic transducing and thereby outputting an electrical signal. Besides, the sensing chip 210 has at least one first connecting point. The carrier chip 230 is disposed below the sensing chip 210 and has at least one second connecting point, at least one electrical channel and at least one channel connecting point. The sealing element 250 is disposed between the sensing chip 210 and the carrier chip 230 for air-tight coupling the sensing chip 210 and the carrier chip 230.

In the present embodiment of the invention, the sensing chip 210 is exemplified by having two first connecting points 211(1) and 211(2); the carrier chip 230 is exemplified by having two second connecting points 231(1) and 231(2), two electrical channels 233(1) and 233(2) and two channel connecting points 235(1) and 235(2). In the electro-acoustic sensing device 200, the second connecting points 231(1) and 231(2) and the channel connecting points 235(1) and 235(2) are located at different surfaces of the carrier chip 230. In present embodiment, the second connecting points 231(1) and 231(2) and the channel connecting points 235(1) and 235(2) are preferably located at the top surface and the bottom surface of the carrier chip 230. One second connecting point 231(1) is electrically contacted with one first connecting point 211(1), and the other second connecting point 231(2) is electrically contacted with the other first connecting point 211(2). The electrical channels 233(1) and 233(2) preferably pass through the top surface and the bottom surface of the carrier chip 230. One electrical channel 233(1) electrically connects the second connecting point 231(1) with the channel connecting point 235(1), and the other electrical channel 233(2) electrically connects the second connecting point 231(2) with the channel connecting point 235(2). The electrical signal outputted from the sensing chip 210 is transmitted to the channel connecting points 235(1) and 235(2) via the first connecting points 211(1) and 211(2), the second connecting points 231(1) and 231(2) and the electrical channels 233(1) and 233(2). The channel connecting points 235(1) and 235(2) are electrically connected to a substrate P such as a printed circuit board (PCB), such that the electrical signal is further transmitted to the substrate P.

The electro-acoustic sensing device 200 further includes an integrated circuit 270. In the present embodiment, the integrated circuit 270 is disposed inside the sensing chip 210 for receiving a signal outputted from a back plate 215 of the sensing chip 210. In addition to the back plate 215, the sensing chip 210 further includes a vibration membrane 213 and has a first cavity 210A. The top opening of the first cavity 210A intercommunicates with the outside of the electro-acoustic sensing device 200. The vibration membrane 213 is located at the bottom of the sensing chip 210 and covers the bottom opening of the first cavity 210A. The back plate 215, preferably has many perforations 215a, is disposed below the vibration membrane 213 in parallel and separated from the vibration membrane 213 by an interval The vibration membrane 213 and the back plate 215 form a capacitor structure 217.

The carrier chip 230 has a second cavity 230A correspondingly located below the first cavity 210A. The vibration membrane 213 and the back plate 215 are located between the first cavity 210A and the second cavity 230A. The two cavities 210A and 230A are separated by the vibration membrane 213. The sensing chip 210 preferably has a through hole 210C which passes through the sensing chip 210 for interconnecting the second cavity 230A and the outside of the electro-acoustic sensing device 200. When a sound signal A enters the first cavity 210A via the top opening of the first cavity 210A and contacts the vibration membrane 213, the vibration membrane 213 vibrates between the two cavities 210A and 230A along with the sound pressure of the sound signal A, such that the capacitance of the capacitor structure 217 is changed. The signal outputted from the back plate 215 is received by the integrated circuit 270 in the sensing chip 210, such that the change in the sound pressure is obtained; therefore, electro-acoustic transducing is performed.

Figure 3:
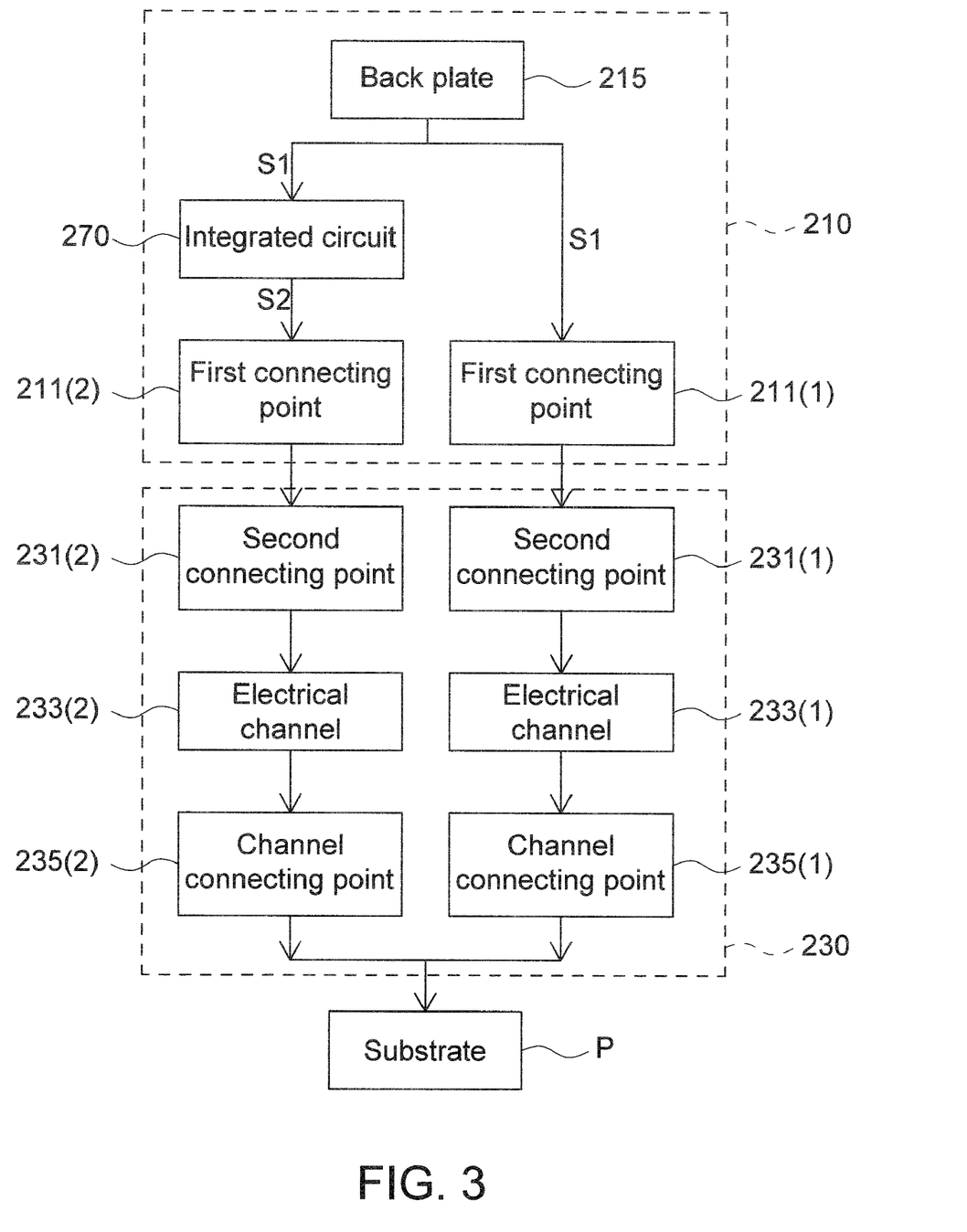
FIG. 3 is an electrical block diagram of the elements in FIG. 1.

On the other hand, the electrical signal outputted from the sensing chip 210 includes the signal outputted from the integrated circuit 270 and the signal outputted from the back plate 215 for example. The electrical connection among the elements and the signals of the electro-acoustic sensing device 200 are disclosed below with reference to FIG. 3, which illustrates an electrical block diagram of the elements in FIG. 1. As indicated in FIG. 3, the back plate 215 is electrically connected to the first connecting point 211(1), and the signal S1 outputted from the back plate 215 is transmitted to the substrate P via the first connecting point 211(1), the second connecting point 231(1), the electrical channel 233(1) and the channel connecting point 235(1). Besides, the integrated circuit 270 is electrically connected to the first connecting point 211(1), and receives the signal S1 outputted from the back plate 215. The integrated circuit 270 outputs another signal S2 according to the signal S1. The signal S2 is transmitted to the substrate P via the first connecting point 211(2), the second connecting point 231(2), the electrical channel 233(2) and the channel connecting point 235(2).

Moreover, the electro-acoustic sensing device 200 of the present embodiment of the invention further includes a cover 290 as indicated in FIG. 2. The cover 290 disposed at the top of the sensing chip 210 has at least one sound entering hole 290a via which the sound signal A enters the first cavity 210A and contacts the vibration membrane 213. The cover 290 is made from metal or polymers and used for filtering and preventing external objects such as dusts, sands or water drops from falling into the first cavity 210A. However, anyone who is skilled in the art will understand that the technology adopted in present embodiment for filtering external objects is not limited thereto. For example, a filter can be disposed at the top of the sensing chip 210 for stopping the external objects. As the filter has many holes, the top opening of the first cavity 210A is merely partly covered so that the sound signal A still can pass through the filter and contact the vibration membrane 213.

Figure 4:
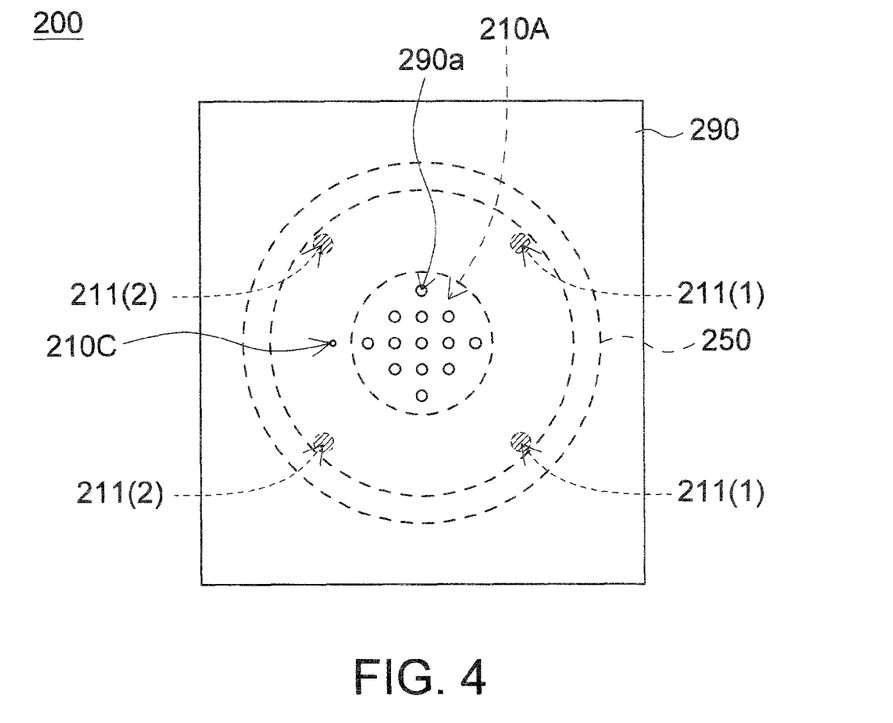
FIG. 4 is a top view of the electro-acoustic sensing device in FIG. 2.

Please refer to FIG. 4, a top view of the electro-acoustic sensing device in FIG. 2 is shown. In the present embodiment, the sealing element 250 is a circular structure for example, and the first connecting points 211(1) and 211(2) and the second connecting points 231(1) and 231(2) are located at the inner sides of the sealing element 250. The sealing element 250 is preferably electrically conductive and is capable of shielding electromagnetic interference to assure the quality of signal transmission between the sensing chip 210 and the carrier chip 230. However, the technology of the invention is not limited thereto. For example, the first connecting points 211(1) and 211(2) and the second connecting points 231(1)

and 231(2) can also be located outside the circular structure of the sealing element 250, and the sealing element 250 can also be non-electrically conductive. For example, the sealing element 250 can be made from a non-conductive material such as rubber. Thus, the flexibility for material selection of the sealing element 250 can be increased.

Figure 5:
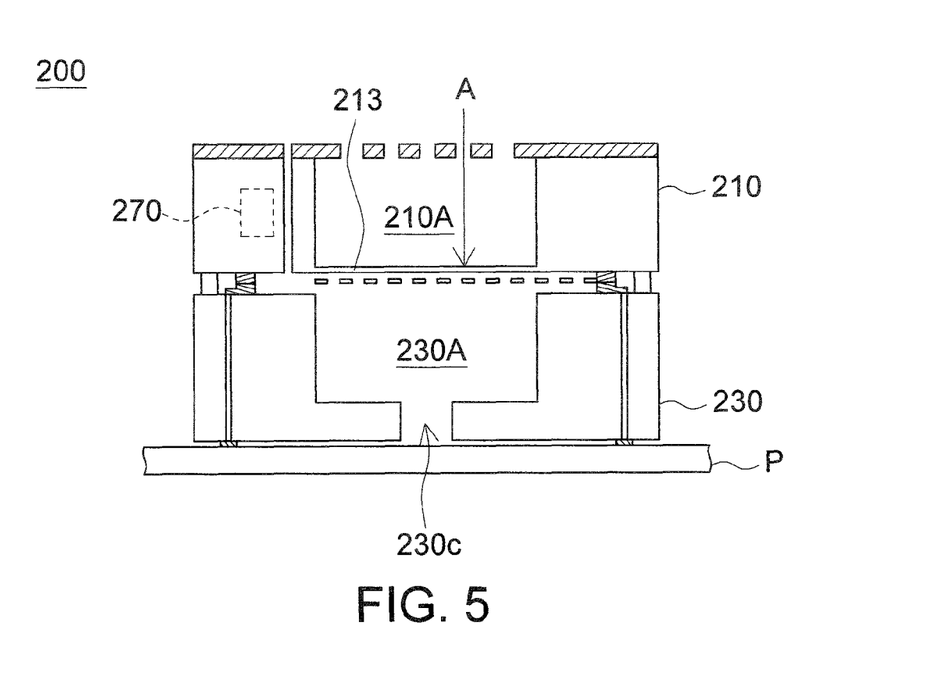
FIG. 5 is a perspective view of the carrier chip in FIG. 2 with an opening.

In the electro-acoustic sensing device 200 of the present embodiment of the invention, the carrier chip 230 can further has an opening. Please refer to FIG. 5, a perspective view of the carrier chip in FIG. 2 with an opening is shown. The opening 230C is located at the bottom of the carrier chip 230 for interconnecting the second cavity 230A and the outside of the electro-acoustic sensing device 200. When the sound signal A enters the first cavity 210A and contacts the vibration membrane 213, the vibration membrane 213 reflects the gradient change of pressure such that the electro-acoustic sensing device 200 is capable of sensing the direction of the sound signal A.

The electro-acoustic sensing device 200 of the present embodiment of the invention is exemplified by a micro-electro-mechanical system (MEMS) microphone, in which the sensing chip 210 and the carrier chip 230 respectively are silicon chips and preferably have the same width. The first cavity 210A and the second cavity 230A can be formed by way of wet etching or dry etching the sensing chip 210 and the carrier chip 230 respectively. The etching processes are well known in the field of the art and are not repeated here. On the other hand, the sensing chip 210 and the carrier chip 230 can be connected by utilizing flip chip bonding technology; and the electro-acoustic sensing device 200 can be bonded onto the substrate P by utilizing surface mount technology, thereby effectively improving manufacturing efficiency. Besides that, the electro-acoustic sensing device 200 of the present embodiment of the invention can be adopted in a wafer-level process, in which an upper wafer and a lower wafer are bonded before sawing them into many electro-acoustic sensing devices 200, each includes one sensing chip 210 and one carrier chip 230.

The electro-acoustic sensing device 200 of the first embodiment of the invention bonds the sensing chip 210 and the carrier chip 230 by way of flip chip bonding technology, such that the manufacturing process is simplified and the manufacturing efficiency is increased. Besides, the electro-acoustic sensing device 200 is connected to the substrate P by utilizing surface mount technology, hence further improving the overall assembly efficiency and decreasing the overall manufacturing costs. Moreover, with the integrated circuit 270 being integrated into the sensing chip 210, the volume of the electro-acoustic sensing device 200 is further decreased.

Second Embodiment

Figure 6:
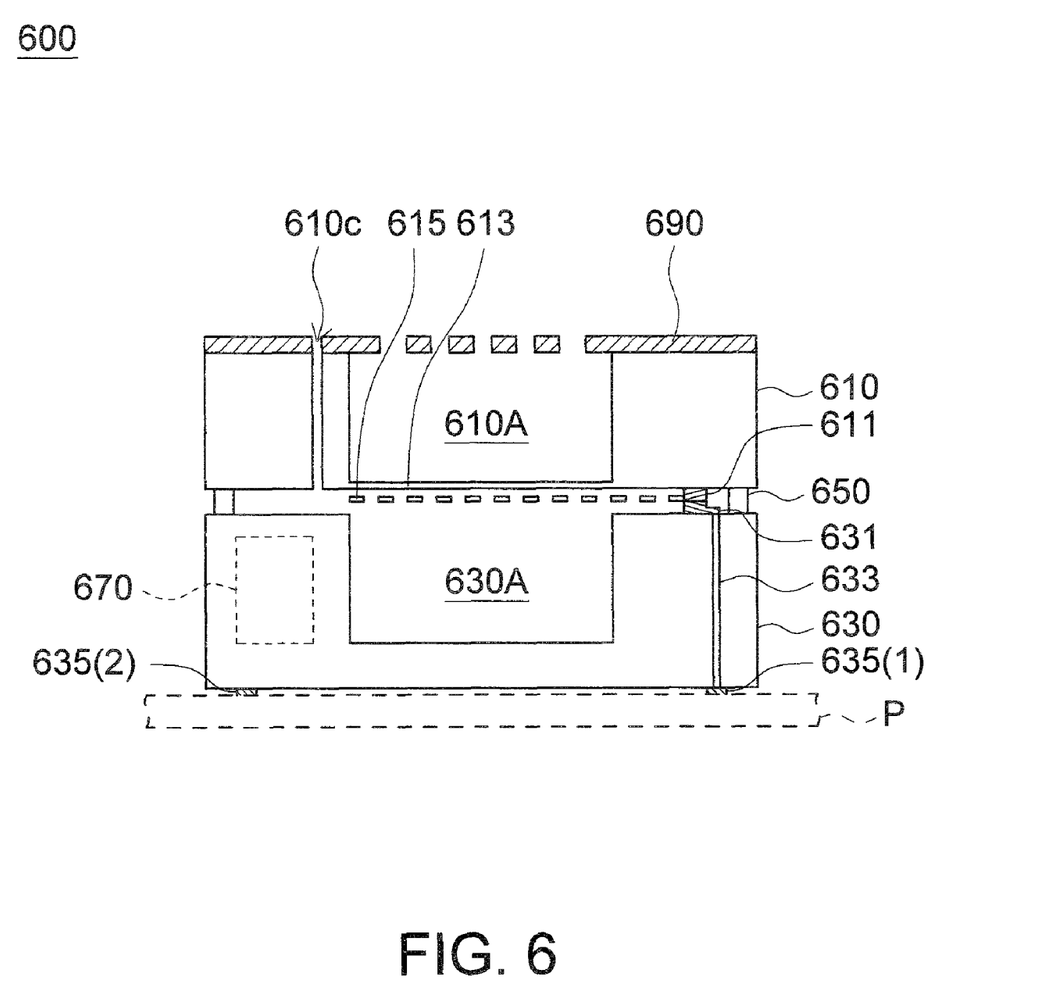
FIG. 6 is a perspective view of an electro-acoustic sensing device according to a second embodiment of the invention.

The electro-acoustic sensing device of the present embodiment of the invention differs from the electro-acoustic sensing device 200 (illustrated in FIG. 2) of the first embodiment in that the integrated circuit of the present embodiment is integrally disposed inside the carrier chip. Referring to FIG. 6, a perspective view of an electro-acoustic sensing device according to a second embodiment of the invention is shown. The electro-acoustic sensing device 600 includes a sensing chip 610, a carrier chip 630, a sealing element 650 and an integrated circuit 670. In the present embodiment, the sensing chip 610 has a first connecting point 611; the carrier chip 630 has a second connecting point 631, an electrical channel 633 and two channel connecting points 635(1) and 635(2). The second connecting point 631 is electrically contacted with the first connecting point 611. The second connecting point 631 and the two channel connecting points 635(1) and 635(2) are preferably located at the top surface and the bottom surface of the carrier chip 630. The electrical channel 633 passes through the top surface and the bottom surface of the carrier chip 630 and electrically connects the second connecting point 631 and the channel connecting point 635(1). The sealing element 650 is disposed between the sensing chip 610 and the carrier chip 630 for air-tight coupling the two chips 610 and 630. In the present embodiment of the invention, the integrated circuit 670 is disposed inside the carrier chip 630 for receiving the signal outputted from a back plate 615 of the sensing chip 610.

According to the electro-acoustic sensing device 600 disclosed in the second embodiment of the invention, the electrical signal outputted from the sensing chip 610 includes the signal outputted from the back plate 615. The signal outputted from the back plate 615 is transmitted to the substrate P via the first connecting point 611, the second connecting point 631, the electrical channel 633 and the channel connecting point 635(1). Furthermore, the integrated circuit 670 transmits the other signal to the substrate P via the other channel connecting point 635(2) according to the signal outputted from the back plate 615.

On the other hand, the dispositions of the back plate 615, the vibration membrane 613, the sealing element 650 and the cover 690 are the same as that in the first embodiment of the invention. Moreover, the design of a first cavity 610A of the sensing chip 610, a through hole 610C of the sensing chip 610 and a second cavity 630A of the carrier chip 630 are similar to that in the first embodiment, and the similarities are not repeated in the present embodiment of the invention.

According to the electro-acoustic sensing device 600 disclosed in the second embodiment of the invention, the integrated circuit 670 is disposed in the carrier chip 630. Signal transmission between the sensing chip 610 and the carrier chip 630 for the signal outputted from the back plate 615 is simply performed between one first connecting point 611 and one second connecting point 631, such that the electrical contact area between the sensing chip 610 and the carrier chip 630 is reduced, and signal decay and noises are decreased accordingly.

Third Embodiment

Figure 7:
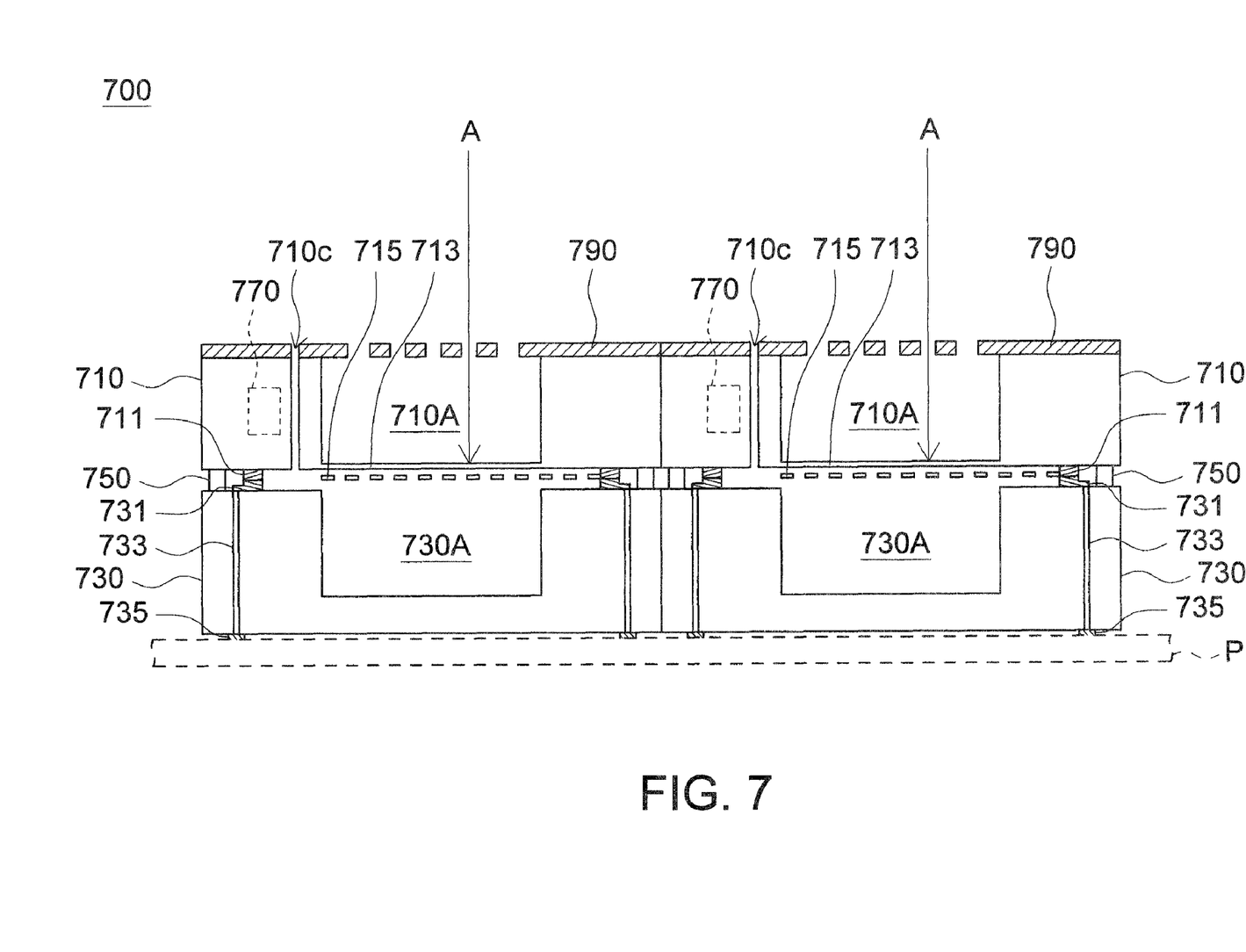
FIG. 7 is a perspective view of an electro-acoustic sensing device according to a third embodiment of the invention.

Referring to FIG. 7, a perspective view of an electro-acoustic sensing device according to the third embodiment of the invention. The electro-acoustic sensing device 700 includes two juxtaposed sensing chips 710, two juxtaposed carrier chips 730 and two sealing elements 750. Each sensing chip 710 is for electro-acoustic transducing and outputting an electrical signal. The two carrier chips 730 are disposed below the two sensing chips 710 respectively. The two sealing elements 750 are disposed between the two sensing chips 710 and the two corresponding carrier chips 730 for air-tight coupling one sensing chip 710 and one carrier chip 730 respectively.

Furthermore, in the present embodiment of the invention, the electro-acoustic sensing device 700 further includes two integrated circuits 770 respectively disposed in the two sensing chips 710. Each sensing chip 710 has two first connecting points 711, a first cavity 710A and a through hole 710C. Each sensing chip 710 includes a vibration membrane 713 and a back plate 715. Moreover, each carrier chip 730 has a second cavity 730A, two second connecting points 731, two electrical channels 733 and two channel connecting points 735. According to the electro-acoustic sensing device 700 of the third embodiment, the dispositions of the first and the second connecting point 711 and 731, the through hole 710C and the sealing element 750 are the same as that in the first embodiment of the invention. Furthermore, the electrical connection among the first, the second channel connecting points 711, 731, the two channel connecting points 735, the electrical channel 733, the back plate 715 and the integrated circuit 770 is the same as that in the first embodiment (illustrated in FIG. 3), and the similarities are not repeated here.

According to the electro-acoustic sensing device 700 disclosed in the third embodiment of the invention, when the same sound signal A respectively enters the two first cavities 710A, and contacts the two vibration membranes 713, the direction of the sound signal A can be detected according to the phase difference of the sound signal A received by two juxtaposed sensing chips 710, such that the electro-acoustic sensing device 700 has the sensitivity to detect acoustic directions.

According to the above-disclosed embodiments of the electro-acoustic sensing device, the integrated circuit is integrated into the sensing chip or the carrier chip, so that the number of the elements and the volume of the electro-acoustic sensing device are effectively reduced. Moreover, the sensing chip and the carrier chip are bonded through flip chip bonding technology and the electro-acoustic sensing device is disposed onto the substrate through surface mount technology, such that the manufacturing process is simplified, the assembly efficiency of manufacturing process is improved, and the manufacturing cost is decreased. Besides, when the first connecting point and the second connecting point are enclosed inside the circular and electrically conductive sealing element, the electromagnetic interference affecting these connecting points can be shielded by the sealing element, so that the quality of signal transmission between the sensing chip and the carrier chip is assured. Furthermore, the electro-acoustic sensing device according to the embodiments of the invention has the ability to sense directions of sound signal by way of receiving the phase difference of the sound signal by two juxtaposed sensing chips. Also, the carrier chip in the electro-acoustic sensing device can be provided with an opening that is intercommunicating with the outside of the second cavity, making the vibration membrane capable of reflecting the gradient change of pressure. In this way, the electro-acoustic sensing device can also have the ability to sense directions of sound signal.

While the invention has been described by way of example and in terms of several preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electro-acoustic sensing device, comprising:
 a sensing chip for electro-acoustic transducing and outputting an electrical signal, wherein the sensing chip comprises:
  at least one first connecting point;
  a first cavity whose top opening intercommunicates with the outside of the electro-acoustic sensing device;
  a vibration membrane located at the bottom of the sensing chip and covering a bottom opening of the first cavity;
  a back plate disposed below the vibration membrane in parallel and separated from the vibration membrane by an interval; and
  an integrated circuit disposed inside the sensing chip for receiving a signal outputted from the back plate;
 a carrier chip disposed below the sensing chip, the carrier chip having at least one second connecting point, at least one electrical channel and at least one channel connecting point, wherein the second connecting point is electrically contacted with the first connecting point, the second connecting point and the channel connecting point are located at different surfaces of the carrier chip, and the electrical channel passes through the carrier chip and electrically connects the second connecting point and the channel connecting point; and
 a sealing element disposed between the sensing chip and the carrier chip for air-tight coupling the sensing chip and the carrier chip;
 wherein the electrical signal is transmitted to the channel connecting point via the first connecting point, the second connecting point and the electrical channel.

2. The electro-acoustic sensing device according to claim 1, the vibration membrane and the back plate form a capacitor structure.

3. The electro-acoustic sensing device according to claim 2, wherein the carrier chip has a second cavity correspondingly located below the first cavity, and the vibration membrane and the back plate are located between the two cavities.

4. The electro-acoustic sensing device according to claim 3, wherein the sensing chip further has a through hole for interconnecting the second cavity and the outside of the electro-acoustic sensing device.

5. The electro-acoustic sensing device according to claim 3, wherein the carrier chip further has an opening located at the bottom of the carrier chip for interconnecting the second cavity and the outside of the electro-acoustic sensing device.

6. The electro-acoustic sensing device according to claim 1, wherein the sensing chip has two first connecting points electrically connected to the integrated circuit and the back plate respectively.

7. The electro-acoustic sensing device according to claim 6, wherein the carrier chip has two second connecting points, two electrical channels and two channel connecting points, and the two second connecting points are electrically contacted with the two first connecting points respectively, and each electrical channel electrically connects one second connecting point and one channel connecting point.

8. The electro-acoustic sensing device according to claim 2, wherein the device further comprises:
 a cover disposed on the sensing chip, wherein the cover has at least one sound entering hole for enabling a sound signal to contact the vibration membrane.

9. The electro-acoustic sensing device according to claim 2, wherein the device further comprises:
 a filter disposed at the top of the sensing chip and partly covering the top opening of the first cavity, wherein a sound signal passes through the filter and contacts the vibration membrane.

10. The electro-acoustic sensing device according to claim 1, wherein the sensing chip and the carrier chip have substantially the same width.

11. The electro-acoustic sensing device according to claim 1, wherein the sealing element is a circular structure, and the first connecting point and the second connecting point are located at the inner side of the sealing element.

12. The electro-acoustic sensing device according to claim 11, wherein the sealing element is electrically conductive.

13. The electro-acoustic sensing device according to claim 1, wherein the sealing element is a circular structure, the first connecting point and the second connecting point are located outside the sealing element.

14. The electro-acoustic sensing device according to claim 13, wherein the sealing element is non-electrically conductive.

15. The electro-acoustic sensing device according to claim 1, wherein the sensing chip is a silicon chip.

16. The electro-acoustic sensing device according to claim 1, wherein the carrier chip is a silicon chip.

17. The electro-acoustic sensing device according to claim 1, wherein the second connecting point and the channel connecting point are respectively located at the two opposite surfaces of the carrier chip.

* * * * *